US008522861B2

(12) United States Patent
Zaffetti et al.

(10) Patent No.: US 8,522,861 B2
(45) Date of Patent: Sep. 3, 2013

(54) INTEGRAL COLD PLATE AND STRUCTURAL MEMBER

(75) Inventors: Mark A. Zaffetti, Suffield, CT (US); Edmund P. Taddey, West Springfield, MA (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 544 days.

(21) Appl. No.: 12/748,490

(22) Filed: Mar. 29, 2010

(65) Prior Publication Data

US 2011/0232863 A1 Sep. 29, 2011

(51) Int. Cl.
*F28F 7/00* (2006.01)
*F28D 15/00* (2006.01)
*F28F 3/12* (2006.01)

(52) U.S. Cl.
USPC ............... 165/80.4; 165/104.33; 165/168

(58) Field of Classification Search
USPC ............ 165/170, 80.5, 168, 171, 167, 143, 165/144, 139, 906, 80.4; 428/182–186
See application file for complete search history.

(56) References Cited

U.S. PATENT DOCUMENTS

| | | | | |
|---|---|---|---|---|
| 1,571,929 A | * | 2/1926 | Bronander | 425/446 |
| 1,847,573 A | * | 3/1932 | Rupp | 165/171 |
| 3,542,636 A | * | 11/1970 | Wandel | 428/178 |
| 3,788,393 A | * | 1/1974 | Plizak | 165/109.1 |
| 4,478,277 A | * | 10/1984 | Friedman et al. | 165/185 |
| 4,941,530 A | * | 7/1990 | Crowe | 165/104.33 |
| 5,088,005 A | | 2/1992 | Ciaccio | |
| 5,269,372 A | | 12/1993 | Chu et al. | |
| 5,740,015 A | * | 4/1998 | Donegan et al. | 361/699 |
| 5,772,111 A | * | 6/1998 | Kirsch | 229/403 |
| 6,130,818 A | | 10/2000 | Severson | |
| 6,167,952 B1 | | 1/2001 | Downing | |
| 6,191,945 B1 | | 2/2001 | Belady et al. | |
| 6,213,195 B1 | | 4/2001 | Downing et al. | |
| 6,482,485 B1 | * | 11/2002 | Pichon | 428/36.9 |
| 6,745,823 B2 | * | 6/2004 | Brost | 165/80.4 |

(Continued)

FOREIGN PATENT DOCUMENTS

| | | |
|---|---|---|
| JP | 2006-332393 | 12/2006 |
| JP | 2008-171840 | 7/2008 |
| WO | 2008020695 | 2/2008 |

OTHER PUBLICATIONS

U.S. Appl. No. 12/748,549, filed Mar. 29, 2010, "Integral Cold Plate and Honeycomb Facesheet Assembly".

(Continued)

*Primary Examiner* — Allen Flanigan
*Assistant Examiner* — Jason Thompson
(74) *Attorney, Agent, or Firm* — Carlson, Gaskey & Olds, P.C.

(57) ABSTRACT

A cold plate assembly is provided having a cold plate with a generally planar member that provides a support surface. The support surface is configured to support a heat generating device. A structural member provides attaching features that are configured to secure the cold plate assembly to a support. The cold plate is secured to the structural member by a braze material. In one example, the cold plate assembly is manufactured by arranging multiple sheets with a first braze material provided between the sheets. The multiple sheets comprise a cold plate. The braze material is heated to mechanically join the multiple sheets to one another and the cold plate to the structural member.

7 Claims, 5 Drawing Sheets

(56) References Cited

U.S. PATENT DOCUMENTS

| | | |
|---|---|---|
| 7,193,850 B2 | 3/2007 | Pal |
| 7,201,217 B2 | 4/2007 | Johnson et al. |
| 7,272,005 B2 | 9/2007 | Campbell et al. |
| 7,302,998 B2 * | 12/2007 | Valenzuela .................. 165/80.4 |
| 7,521,789 B1 | 4/2009 | Rinehart et al. |
| 7,584,781 B2 * | 9/2009 | Lai et al. ...................... 165/80.4 |
| 2003/0173068 A1 * | 9/2003 | Davies et al. ................. 165/170 |
| 2003/0178182 A1 * | 9/2003 | Pikovsky et al. ............ 165/80.4 |
| 2006/0108100 A1 * | 5/2006 | Goldman et al. ............ 165/80.4 |
| 2006/0243431 A1 * | 11/2006 | Martin et al. ................. 165/170 |
| 2006/0266508 A1 * | 11/2006 | Johnson et al. .............. 165/170 |
| 2007/0023168 A1 * | 2/2007 | Flesch et al. ................ 165/80.4 |
| 2007/0076374 A1 | 4/2007 | Mongia et al. |
| 2007/0163765 A1 * | 7/2007 | Rondier et al. ............... 165/153 |
| 2008/0029255 A1 * | 2/2008 | Orlandi ......................... 165/152 |
| 2009/0107655 A1 | 4/2009 | Kajiura |
| 2010/0218923 A1 * | 9/2010 | Kang ............................ 165/170 |

OTHER PUBLICATIONS

U.S. Appl. No. 12/748,572, filed Mar. 29, 2010, "Compact Cold Plate Configuration Utilizing Ramped Closure Bars".
U.S. Appl. No. 12/748,552, filed Mar. 29, 2010, "Compact Two Sided Cold Plate With Transfer Tubes".
U.S. Appl. No. 12/748,495, filed Mar. 29, 2010, "Cold Plate With Integral Structural Fluid Port".
U.S. Appl. No. 12/748,576, filed Mar. 29, 2010, "Compact Two Sided Cold Plate With Threaded Inserts".
European Search Report for European Patent Application No. 11250263.8 completed Nov. 20, 2012.

* cited by examiner

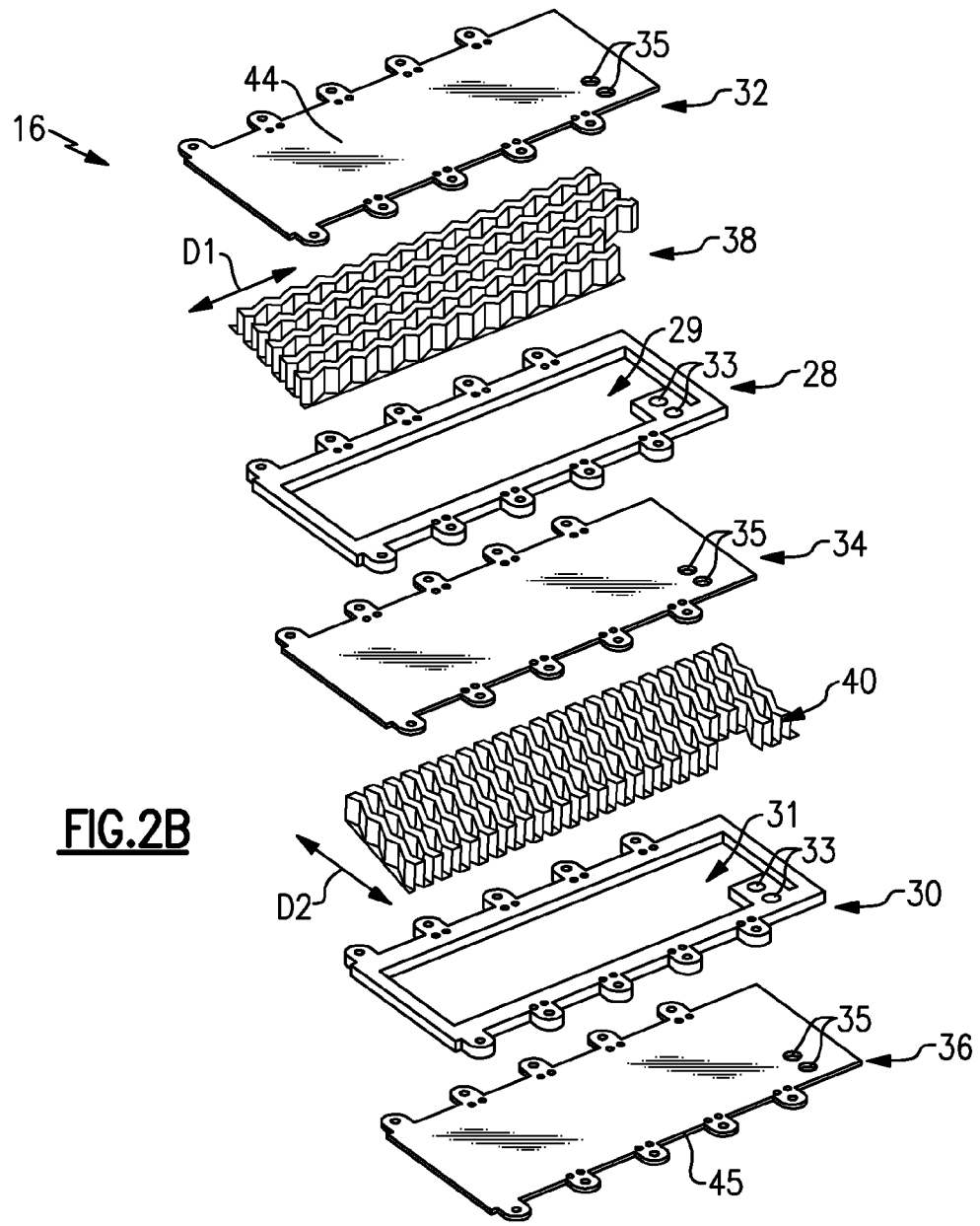
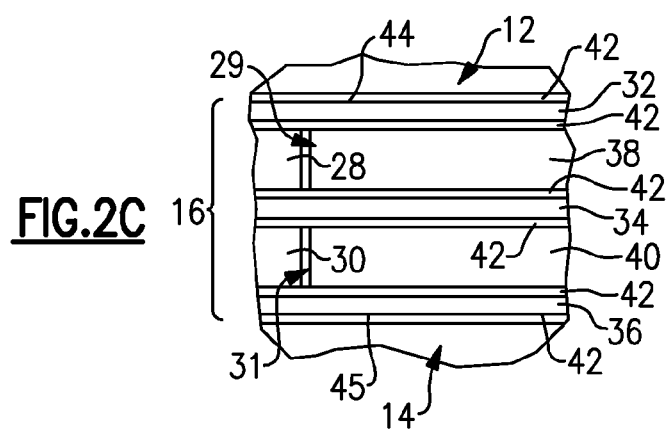

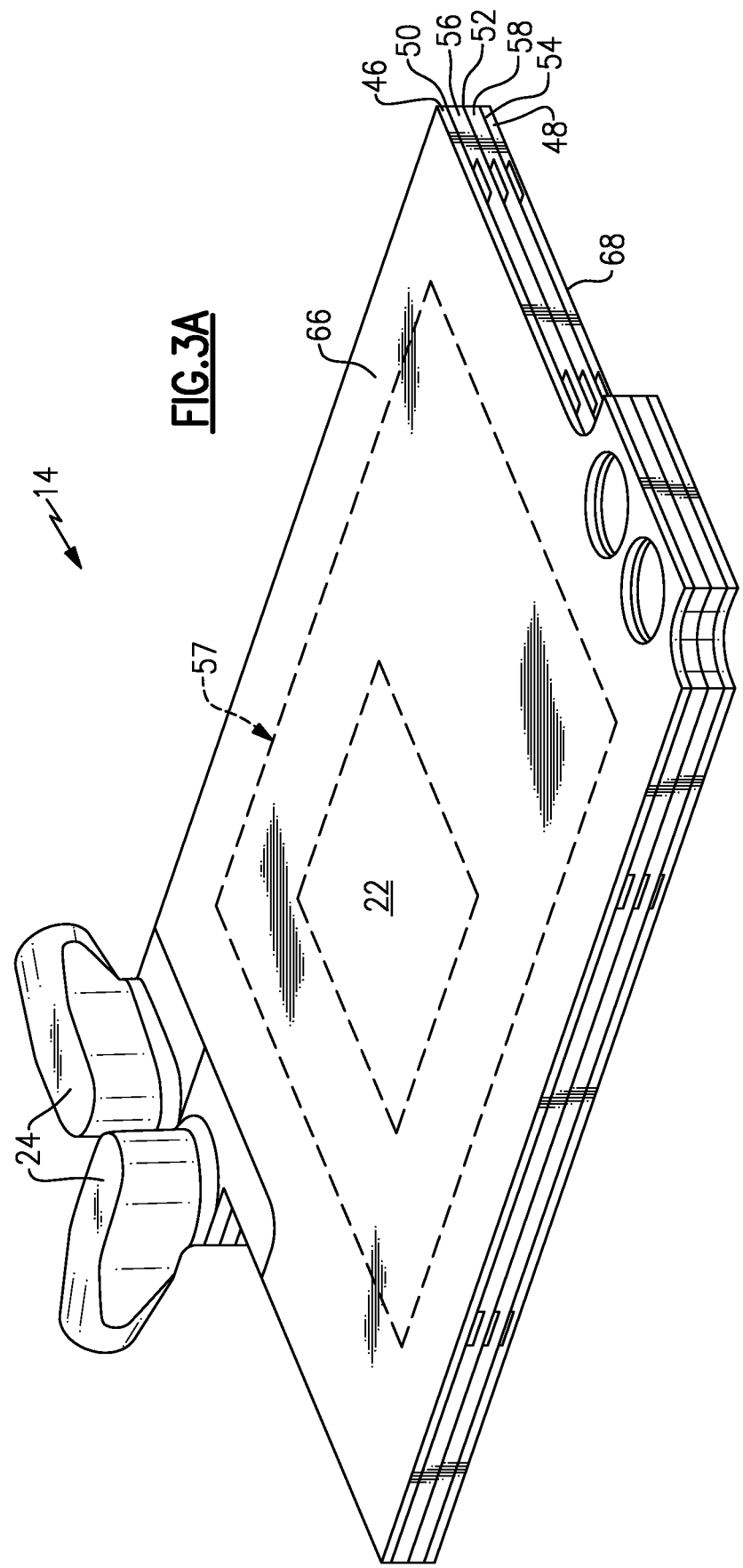

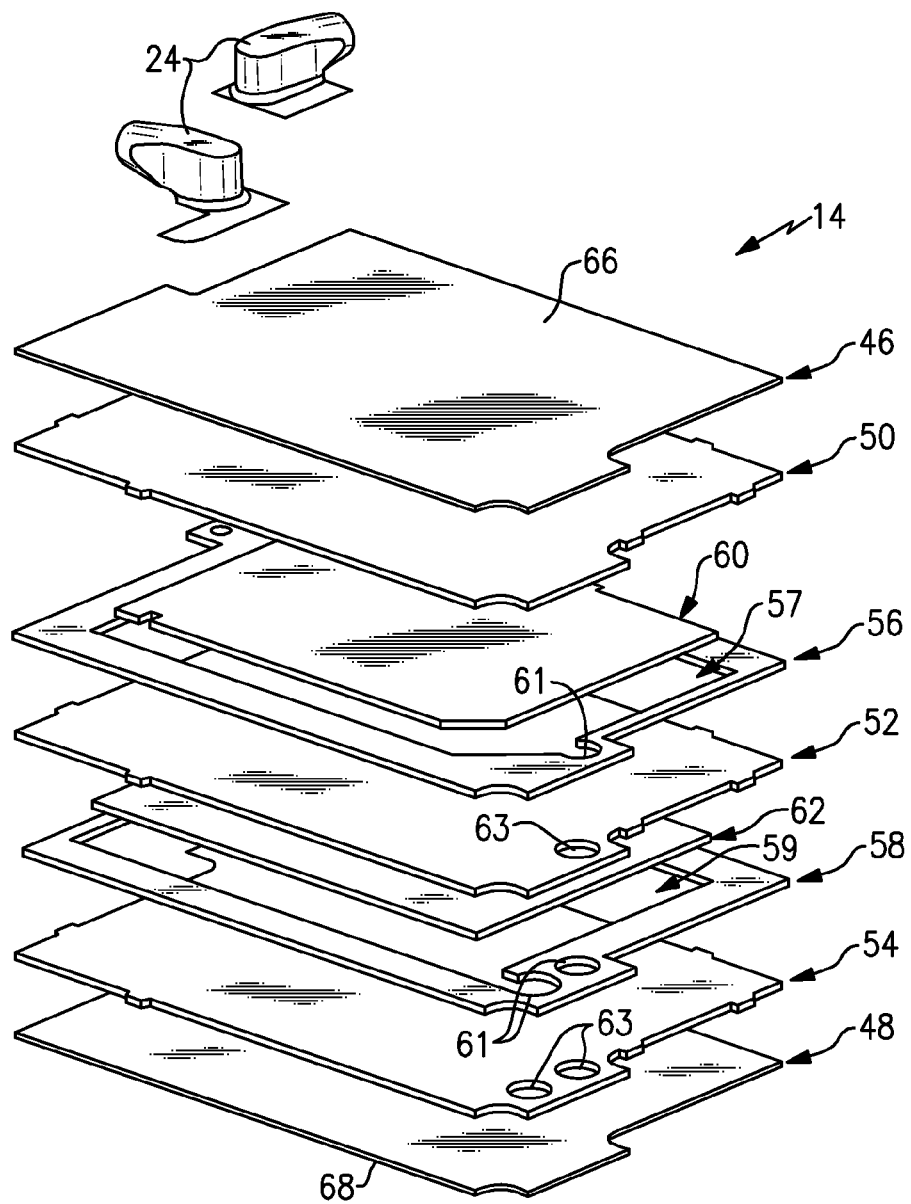
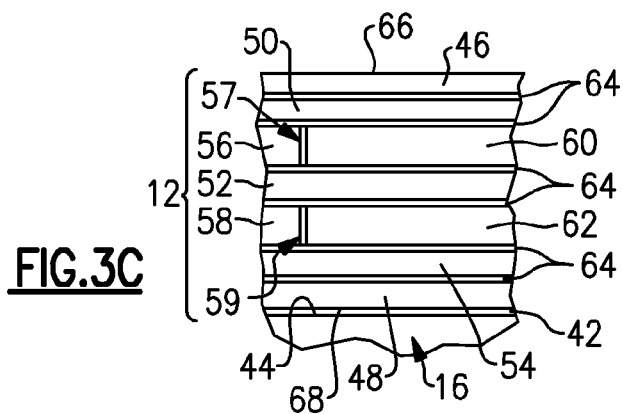
FIG.3B
FIG.3C

US 8,522,861 B2

INTEGRAL COLD PLATE AND STRUCTURAL MEMBER

STATEMENT REGARDING FEDERALLY SPONSORED RESEARCH OR DEVELOPMENT

This subject of this disclosure was made with government support under Contract No.: NNJ06TA25C awarded by National Aeronautics and Space Administration. The government therefore may have certain rights in the disclosed subject matter.

BACKGROUND

This disclosure relates to a cold plate assembly used, for example, in cooling electronics or avionics.

In a typical cold plate assembly, there is a cold plate secured to a structural member. The structural member is secured to a support such as a wall of a cabin, cargo or electronics bay. The cold plate supports a heat generating device, such as electronics equipment. Cooling fluid flows through the cold plate to provide cooling to the heat generating device that is mounted to the cold plate. The cold plate is separately assembled from the structural member and then is subsequently attached to the structural member by mechanical means, such as fastening elements and/or adhesive. The combined cold plate and structural member provides the means for supporting the structural load of the heat generating device.

SUMMARY

A cold plate assembly is provided having a cold plate with a generally planar member that provides a support surface. The support surface is configured to support a heat generating device. A structural member provides attaching features that are configured to secure the cold plate assembly to a support. The cold plate is secured to the structural member by a braze material.

In one example, the cold plate assembly is manufactured by arranging multiple sheets with a first braze material provided between the sheets. One of the multiple sheets provides an external support surface that is configured to support the heat generating device. The multiple sheets provide an internal fluid passage arranged to overlap the support surface. The multiple sheets comprise a cold plate. At least one structural member is arranged adjacent to the cold plate with a second braze material provided between the cold plate and the structural member. The first and second braze materials are heated to mechanically join the multiple sheets to one another and the cold plate to the structural member.

BRIEF DESCRIPTION OF THE DRAWINGS

The disclosure can be further understood by reference to the following detailed description when considered in connection with the accompanying drawings wherein:

FIG. 2B is an exploded perspective view of the structural member shown in FIG. 2A.

FIG. 2C is a cross-sectional view of the structural member illustrated in FIG. 2A.

FIG. 3A is a perspective view of a cold plate.

FIG. 3B is an exploded perspective view of the cold plate shown in FIG. 3A.

FIG. 3C is a cross-sectional view of a portion of the cold plate.

DETAILED DESCRIPTION

Figure 1:
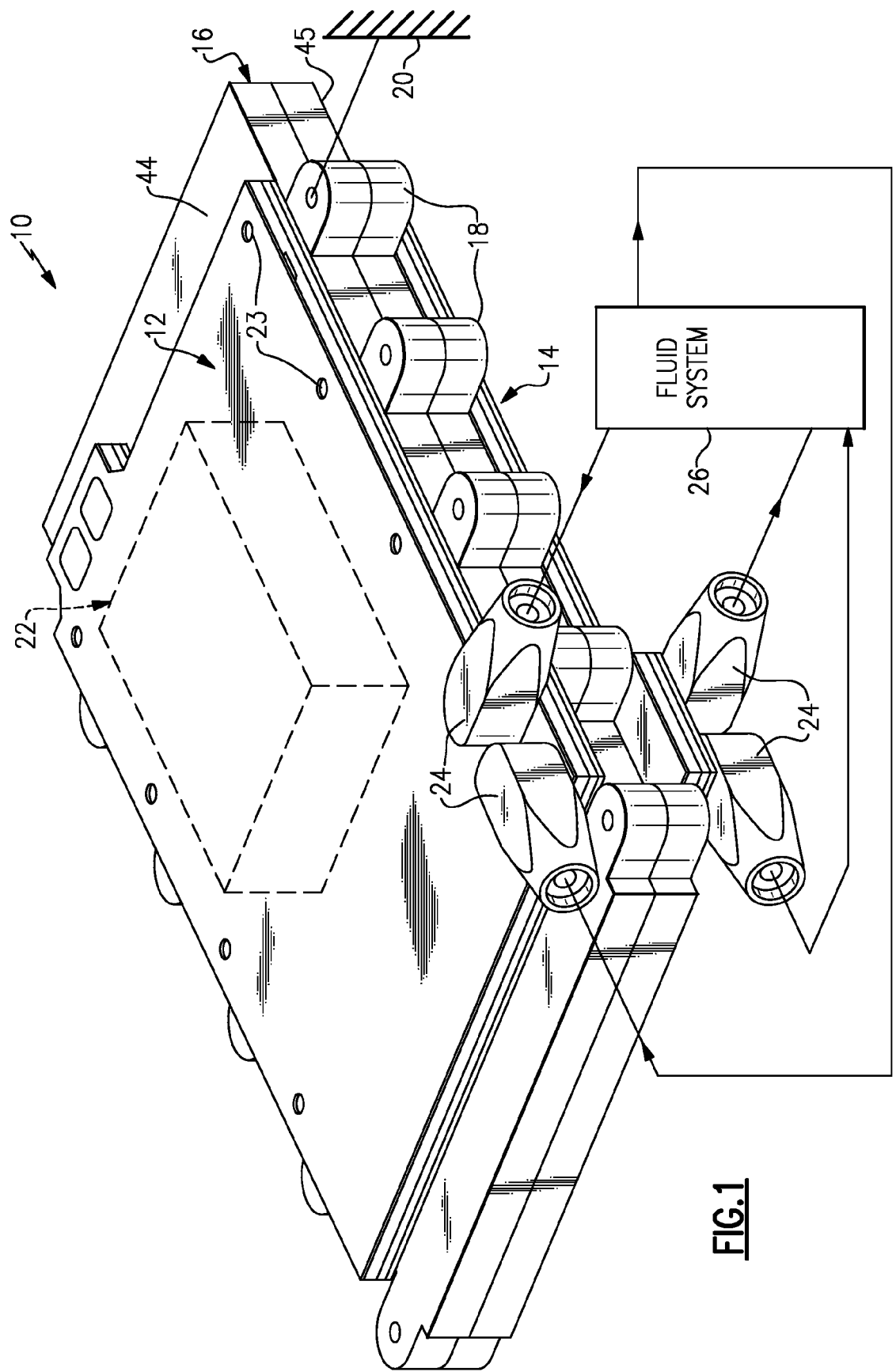
FIG. 1 is a perspective view of an example cold plate assembly.

A cold plate assembly 10 is illustrated in FIG. 1. The assembly 10 includes a first and second cold plates 12, 14 supported on opposing sides of a structural member 16. The structural member 16 includes attaching features 18 that are used to secure the assembly 10 to a support 20. In one example, the attaching features 18 are provided by multiple tabs having holes that are adapted to receive fastening elements, which are secured to a bracket (not shown) mounted to the support 20. In one instance, the planar area (which is the area that supports the device(s) 22 to be cooled) of the structural member 16 is larger than that of each cold plate 12, 14.

A heating device 22 is supported on a surface of the cold plate 12. In one example, the heat generating device 22 is electronics and/or avionics. The heat generating device 22 may be secured to the cold plate 12 using attaching features 23, for example. Fluid ports 24 are mounted on each of the cold plates 12, 14 and communicate cooling fluid between the cold plates 12, 14 and a fluid system 26 that circulates the cooling fluid to the assembly 10. The cooling fluid circulates through the cold plates 12, 14 in an area beneath the heat generating device 22. In one example, an internal fluid passage within the cold plate 14 overlaps the surface supporting the heat generating device 22 (see, for example, dashed lines in FIG. 3A). Although a pair of cold plates 12, 14 is illustrated as being mounted on the structural member 16, it should be understood that fewer or more cold plates may be used. Moreover, one or more heat generating devices 22 may be mounted on each of the cold plates 12, 14.

Figure 2A:
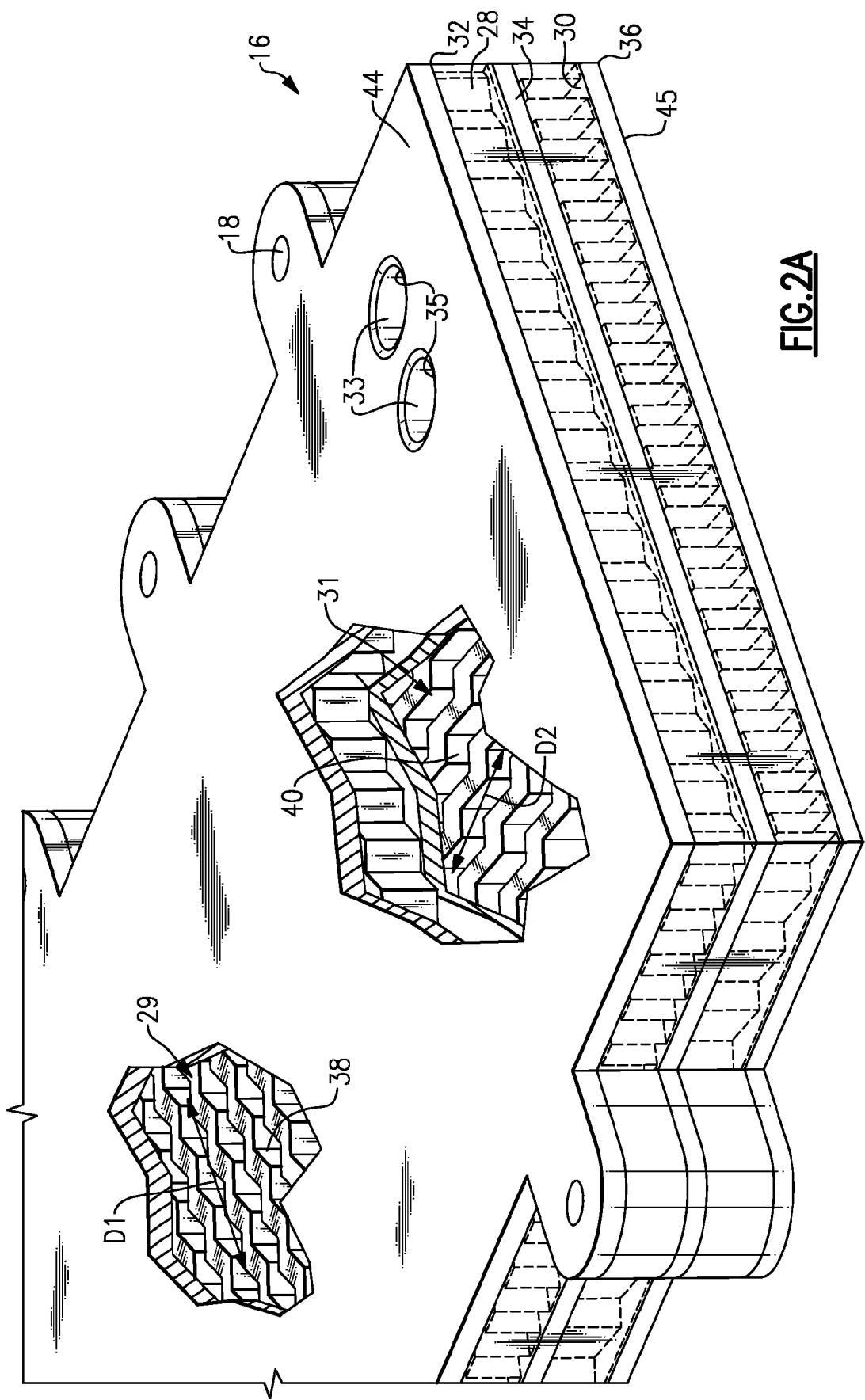
FIG. 2A is a perspective view of a structural member partially broken to reveal several components of the structural member.

An example structural member 16 is shown in more detail in FIGS. 2A-2C. In one example, the structural member 16 includes first and second frames 28, 30 that each include a cavity 29, 31, respectively. First and second reinforcing layers 38, 40 are respectively arranged in the cavities 29, 31. In one example, the first reinforcing layer 38 is an arrangement of fins along a first direction D1, and the second reinforcing layer 40 is an arrangement of fins in a second direction D2 that is transverse to the first direction D1. The first and second frames 28, include frame passages 33 that communicate cooling fluid between the first and second cold plates 12, 14. In the example, the cooling fluid is limited to an insubstantial portion of the structural member 16, and for example, prevented from flowing into the cavities 29, 31. The first and second reinforcing layers 38, 40 are primarily used for structural support and are not exposed to cooling fluid flow. In one example, less than 1% of the volume of the structural member 16 may contain cooling fluid during operation. By contrast, a cooling plate devotes approximately 70% of its volume to cooling fluid. For cold plate assemblies that only use a cold plate on one side of the structural member, there may be no fluid passages through the structural member 16.

First, second and third sheets 32, 34, 36 are arranged on opposing sides of the first and second frames 28, 30 and the first and second reinforcing layers 38, 40 as illustrated in FIGS. 2A-2C. The first, second and third sheets 32, 34, 36 include sheet passages 35 aligned with frame passages 33 to communicate cooling fluid between the first and second cold plates 12, 14. Referring to FIG. 2C, a first braze material 42 is arranged between the first and second frames 28, 30; the first, second and third sheets 32, 34, 36; and the first and second reinforcing layers 38, 40 to provide a sandwich of layers mechanically adhered to one another when the first braze material 42 is subject to a heat above the melting temperature and subsequently cooled. The first and third sheets 32, 36 respectively provide first and second surfaces 44, 45 that respectively support first and second cold plates 12, 14. As illustrated in FIG. 2C, the first and second cold plates 12, 14 are respectively secured to the first and second surfaces 44, 45 with the first braze material 42.

An example second cold plate 14 is illustrated in FIGS. 3A-3C. The cold plate 14 includes first and second end sheets 46, 48. The first end sheet 46 includes a first surface 66, which supports the heat generating device 22 (schematically illustrated in FIG. 3A). The second end sheet 48 provides a second surface 68, which is secured to the structural member 16 by the first braze material 42.

The cold plate 14 includes multiple layers, which include, for example, first, second and third parting sheets 50, 52, 54 sandwiching first and second closure bars 56, 58. The first and second closure bars 56, 58 respectively include cavities 57, 59 within which first and second fin structures 60, 62 are disposed. The second and third parting sheets 52, 54 include sheet passage 63. The first and second closure bars 56, 58 include bar passages 61 that are in fluid communication with the sheet passages 63. The bar passages 61 and the sheet passages 63 are in fluid communication with the fluid ports 24 to supply cooling fluid to the cavities 57, 59. Fluid flow through the cavities 57, 59 and their associated first and second fin structures 60, 62 provides cooling to the heat generating device 22 supported on the cold plate 14. A second braze material 64, which may be the same as the first braze material 42 is used to secure the layers of the cold plate 14 to one another.

During manufacturing, the layers of the cold plates 12, 14 and structural members 16 are arranged on top of one another, with the braze material between the layers. In one example, the layers are constructed from an aluminum, such as 3004 and/or 6951, and the braze material is CT-23 or a Multiclad alloy with a normal thickness of 0.016 inches (0.4 mm). The first and second cold plates 12, 14 and the structural members 16 may be arranged in a fixture with one another and heated to the melting temperature of the braze material to simultaneously secure the layers of the first and second cold plate 12, 14 and structural members 16 to one another and the first and second cold plates 12, 14 to the structural members 16 while applying a load to the first and second cold plates 12, 14 and the structural members 16. In this manner, an integral; monolithic cold plate assembly 10 is formed simultaneously.

Although an example embodiment has been disclosed, a worker of ordinary skill in this art would recognize that certain modifications would come within the scope of the claims. For that reason, the following claims should be studied to determine their true scope and content.

What is claimed is:

1. A cold plate assembly comprising:
   a cold plate having a generally planar member providing a support surface configured to support a heat generating device;
   a structural member providing attaching features configured to secure the cold plate assembly to a support, the cold plate secured to the structural member by a braze material, wherein the attaching features include tabs with holes configured to be removably secured to the support;
   wherein the structural member includes a frame providing a cavity, and a reinforcing layer disposed within the cavity and secured to adjacent sheets;
   wherein the cavity extends across a substantial portion of the structural member, and the structural member is configured to prevent cooling fluid from flowing into the cavity during an operating condition; and
   a fluid port secured to the cold plate, wherein the fluid port is in fluid communication with sheet passages in the structural member outside of the cavity.

2. A cold plate assembly comprising:
   a first cold plate having a generally planar member providing a support surface configured to support a heat generating device;
   a structural member providing attaching features configured to secure the cold plate assembly to a support, the first cold plate secured to a first side of the structural member by a braze material;
   a second cold plate having a generally planar member, wherein the second cold plate is secured to a second side of the structural member by a braze material, the second side opposite the first side;
   wherein the structural member includes a first frame providing a cavity, and a reinforcing layer disposed within the cavity and secured to adjacent sheets;
   wherein the cavity extends across a substantial portion of the structural member, and the structural member is configured to prevent cooling fluid from flowing into the cavity during an operating condition; and
   wherein the first frame includes first frame passages outside the cavity, the adjacent sheets include sheet passages, and the sheet passages are aligned with the frame passages, the sheet passages and frame passages communicating cooling fluid between the first and second cold plates.

3. The cold plate assembly of claim 2, wherein the structural member includes a second frame, the second frame providing a second cavity, and a second reinforcing layer disposed within the second cavity and secured to adjacent sheets;
   wherein the second cavity extends across a substantial portion of the structural member, and the structural member is configured to prevent cooling fluid from flowing into the second cavity during an operating condition; and
   wherein the second frame includes second frame passages outside the second cavity, the second frame passages aligned with the sheet passages and the first frame passages to communicate fluid between the first and second cold plates.

4. The cold plate assembly of claim 3, wherein the adjacent sheets include a first sheet, a second sheet, and a third sheet, the first frame arranged between the first and second sheets, and the second frame arranged between the second and third sheets.

5. The cold plate assembly of claim 2, having fluid ports mounted on each of the first and second cold plates.

6. The cold plate assembly of claim 2, the sheet passages and frame passages creating first and second structural fluid passages, the direction of fluid flow through the first structural fluid passage opposing the direction of fluid flow through the second structural fluid passage.

7. The cold plate assembly of claim 2, wherein the first cold plate includes first and second cold plate sheets with a fluid passage arranged between the first and second cold plate sheets, the first cold plate sheet providing a first support surface and the second cold plate sheet secured to the structural member; and
   the second cold plate includes third and fourth cold plate sheets with a second fluid passage arranged between the third and fourth cold plate sheets, the third cold plate sheet providing a second support surface and the fourth cold plate sheet secured to the structural member.

\* \* \* \* \*